US012652930B2

(12) United States Patent
Zhou et al.

(10) Patent No.: US 12,652,930 B2
(45) Date of Patent: Jun. 9, 2026

(54) DISPLAY PANEL AND DISPLAY DEVICE

(71) Applicant: Shenzhen China Star Optoelectronics Semiconductor Display Technology Co., Ltd., Shenzhen (CN)

(72) Inventors: Libin Zhou, Shenzhen (CN); Shijian Qin, Shenzhen (CN); Xialiang Yuan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 139 days.

(21) Appl. No.: 18/897,076

(22) Filed: Sep. 26, 2024

(65) Prior Publication Data

US 2025/0255144 A1     Aug. 7, 2025

(30) Foreign Application Priority Data

Feb. 4, 2024    (CN) .......................... 202410165970.0

(51) Int. Cl.
*H10K 59/80*        (2023.01)
*H10K 59/12*        (2023.01)
*H10K 59/131*       (2023.01)

(52) U.S. Cl.
CPC ... *H10K 59/80522* (2023.02); *H10K 59/1201* (2023.02); *H10K 59/131* (2023.02); *H10K 59/8792* (2023.02)

(58) Field of Classification Search
CPC ............................................... H10K 59/80522
See application file for complete search history.

(56) References Cited

U.S. PATENT DOCUMENTS

| 10,964,772 B2 * | 3/2021 | Xu ..................... H10K 59/80524 |
| 2022/0254845 A1 * | 8/2022 | Wei ................... H10K 59/80522 |
| 2023/0189606 A1 * | 6/2023 | Wu ......................... H10K 71/00 |
| | | 257/40 |
| 2024/0224711 A1 * | 7/2024 | Lee ...................... H10K 59/124 |

FOREIGN PATENT DOCUMENTS

CN          118055659 A  *  5/2024  ........... H10K 59/131

* cited by examiner

*Primary Examiner* — Joseph L Williams
(74) *Attorney, Agent, or Firm* — Nathan & Associates Patent Agents Ltd.; Menachem Nathan

(57) ABSTRACT

A display panel and a display device are provided. By configuring an auxiliary cathode layer such that a lateral end of a second auxiliary cathode extends beyond a lateral end of the first auxiliary cathode, a full-surface application of light-emitting materials can be realized during the formation of subpixels. This setup facilitates the segmentation of the light-emitting material layer, enabling the formation of light-emitting material sections in the respective subpixels, with cathodes aligned with the light-emitting material sections. This design prevents overlapping of different light-emitting colors that could lead to display anomalies. Accordingly, the display panel operates effectively without the need of using mask plates for forming the subpixels, increasing the pixel density of the display panel. Also, the contact between the cathode and a lateral side of the second auxiliary cathode reduces the impedance of the cathode.

18 Claims, 6 Drawing Sheets

(a)

(b)

DISPLAY PANEL AND DISPLAY DEVICE

CROSS-REFERENCE TO RELATED APPLICATION

This disclosure claims priority to Chinese Patent Application No. 202410165970.0, filed with the China National Intellectual Property Administration (CNIPA) on Feb. 4, 2024, the disclosure of which is incorporated herein by reference in its entirety.

TECHNICAL FIELD

The present application relates to the field of display technology, specifically to a display panel and a display device.

DESCRIPTION OF RELATED ART

Organic light-emitting diode (OLED) display devices are widely used across various fields due to their lightweight, wide viewing angle, fast response, low-temperature resilience, high luminous efficiency, and ability to be fabricated into flexible displays. To achieve color display, OLED devices utilize multiple precision metal mask processes to form red, blue, and green subpixels. However, due to the size and precision limitations of the mask plates, a certain margin for process error must be reserved when forming subpixels. This results in lower pixel density in OLED displays formed using mask plates, making them unsuitable for large-scale display devices.

Thus, existing OLED display devices face a technical issue of lower pixel density due to the need to reserve process error margins in the mask plate-based subpixel formation process.

SUMMARY OF INVENTION

The present application offers a display panel and a display device to address the technical challenges in existing OLED display devices. These challenges arise from the need to reserve margins for process errors when forming subpixels using mask plates, which results in lower pixel density in OLED displays.

The present application provides a display panel, including:
- a substrate;
- a driving circuit layer disposed on one side of the substrate;
- a pixel electrode layer disposed on one side of the driving circuit layer away from the substrate;
- an auxiliary cathode layer disposed on one side of the pixel electrode layer away from the driving circuit layer, wherein the auxiliary cathode layer includes a first auxiliary cathode and a second auxiliary cathode, and the first auxiliary cathode is disposed between the second auxiliary cathode and the pixel electrode layer;
- a light-emitting material layer disposed on one side of the auxiliary cathode layer away from the pixel electrode layer, wherein the light-emitting material layer includes a plurality of light-emitting material sections of different emitting colors; and
- a cathode layer disposed on one side of the light-emitting material layer away from the auxiliary cathode layer, wherein the cathode layer includes a plurality of cathodes arranged spaced from each other, and the cathodes are respectively aligned with the light-emitting material sections of different emitting colors;

wherein the display panel includes a plurality of subpixels arranged in an array; within each of the subpixels, a lateral end of the second auxiliary cathode extends beyond a lateral end of the first auxiliary cathode, the auxiliary cathode layer segments the light-emitting material layer, and the cathode contacts a lateral side of the second auxiliary cathode.

In some embodiments, the auxiliary cathode layer further includes a third auxiliary cathode, the third auxiliary cathode is disposed on one side of the second auxiliary cathode that is away from the first auxiliary cathode, and the lateral end of the second auxiliary cathode extends beyond a lateral end of the third auxiliary cathode.

In some embodiments, the second auxiliary cathode is made of a conductive material, and adjacent ones of the cathodes contact two lateral sides of the second auxiliary cathode disposed between the adjacent cathodes.

In some embodiments, the pixel electrode layer includes a plurality of pixel electrodes and a plurality of auxiliary electrodes, the pixel electrodes and the auxiliary electrodes are arranged at intervals, and the auxiliary electrodes contact the cathode layer.

In some embodiments, the display panel further includes a display area, wherein the display area includes a light-emitting area and a non-light-emitting area, and the light-emitting material section includes a first part, a second part, and a third part; the first part is disposed in the light-emitting area and arranged between the pixel electrode and the cathode, and the first part extends into an area where the lateral end of the second auxiliary cathode extends beyond the lateral end of the first auxiliary cathode; the second part is disposed in the non-light-emitting area and extends into the light-emitting area and arranged between the cathode and the third auxiliary cathode, and the second part extends into an area where the lateral end of the second auxiliary cathode extends beyond the lateral end of the first auxiliary cathode; a projection of the second part on the substrate overlaps with a projection of the first part on the substrate, and the second auxiliary cathode is located between the first part and the second part; in an area where the lateral end of the second auxiliary cathode extends beyond the lateral end of the third auxiliary cathode, the third part is disposed on one side of the second auxiliary cathode that is away from the third auxiliary cathode, and a projection of the third part on the substrate overlaps with the projection of the second part on the substrate, with the second auxiliary cathode disposed between the second part and the third part.

In some embodiments, the auxiliary electrode includes a first electrode section, a second electrode section, and a third electrode section; the second electrode section is disposed between the first electrode section and the third electrode section, with a lateral end of the second electrode section extending beyond lateral ends of both the first electrode section and the third electrode section; the light-emitting material section further includes a fourth part disposed in the non-light-emitting area; the fourth part is disposed in an area where the lateral end of the second electrode section extends beyond the lateral end of the third electrode section, and is arranged between the second electrode section and the driving circuit layer.

In some embodiments, the auxiliary electrode includes a via hole, the cathode is disposed in the via hole, and the cathode contacts lateral sides of the second electrode section.

In some embodiments, the driving circuit layer includes a light-shielding layer, the light-shielding layer includes a first connection electrode and a second connection electrode spaced apart from each other, the first connection electrode is electrically connected to the auxiliary electrode, and the second connection electrode is electrically connected to the pixel electrode.

In some embodiments, the display panel further includes an inorganic layer, wherein the inorganic layer is disposed on one side of the cathode layer that is away from the light-emitting material layer, the inorganic layer includes a plurality of inorganic sections, and the inorganic sections are disposed corresponding to the cathodes.

In addition, the present application provides a display device. The display device includes the display panel described in any of the above embodiments.

Beneficial Effects: The present application provides a display panel and a display device; the display panel includes a substrate, a driving circuit layer, a pixel electrode layer, an auxiliary cathode layer, a light-emitting material layer, and a cathode layer. The driving circuit layer is disposed on one side of the substrate, the pixel electrode layer is positioned on one side of the driving circuit layer that is away from the substrate, and the auxiliary cathode layer is disposed on one side of the pixel electrode layer that is away from the driving circuit layer. The auxiliary cathode layer includes a first auxiliary cathode and a second auxiliary cathode, with the first auxiliary cathode positioned between the second auxiliary cathode and the pixel electrode layer. The light-emitting material layer is disposed on one side of the auxiliary cathode layer that is away from the pixel electrode layer and includes a plurality of light-emitting material sections of different emitting colors. The cathode layer is disposed on one side of the light-emitting material layer that is away from the auxiliary cathode layer and includes a plurality of cathodes arranged spaced from each other, the cathodes disposed corresponding to the light-emitting material sections of different emitting colors. The display panel includes a plurality of subpixels arranged in an array. Within each subpixel, a lateral end of the second auxiliary cathode extends beyond a lateral end of the first auxiliary cathode, the light-emitting material layer is segmented by the auxiliary cathode layer, and the cathode contacts a lateral side of the second auxiliary cathode. By configuring the auxiliary cathode layer so that the lateral end of the second auxiliary cathode extends beyond the lateral end of the first auxiliary cathode, it allows the full-surface application of light-emitting materials when forming the light-emitting material sections corresponding to the sub-pixels. The auxiliary cathode layer interrupts the light-emitting material layer to form the light-emitting material sections for the respective subpixels, with the cathodes aligned with the light-emitting material sections. This setup avoids the overlap of the light-emitting material sections of different emitting colors, which could lead to display anomalies, thus ensuring the display panel functions properly while eliminating the need for mask plates to form the subpixels, thereby increasing the pixel density of the display panel. Additionally, the contact between the cathode and the lateral side of the second auxiliary cathode reduces the impedance of the cathode.

BRIEF DESCRIPTION OF DRAWINGS

The technical solutions and other beneficial effects of the present application become apparent through a detailed description of the specific embodiments in conjunction with the accompanying drawings.

Figure 1:
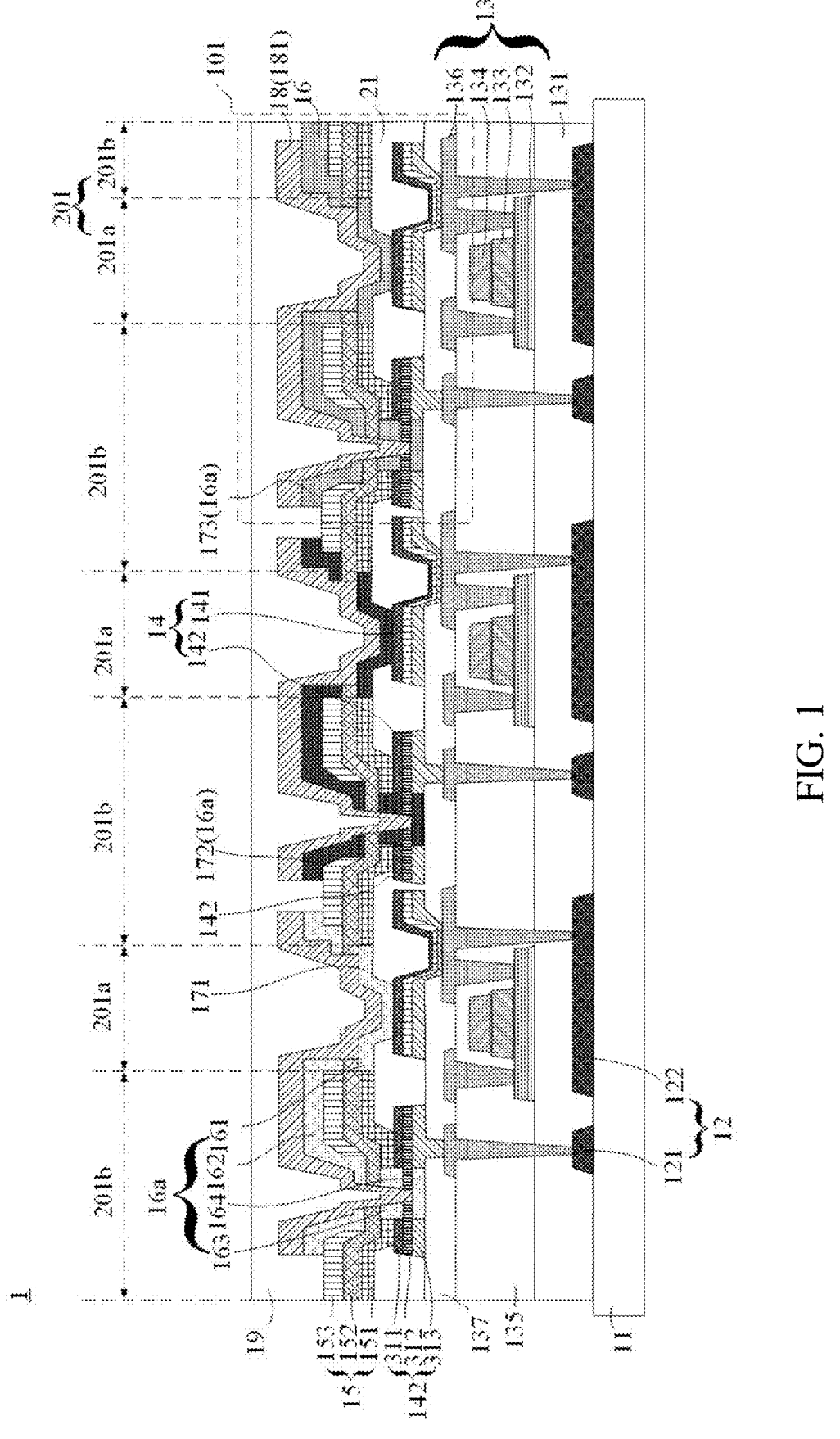
FIG. 1 is a first schematic view of a display panel provided by one embodiment of the present application.

DETAILED DESCRIPTION OF EMBODIMENTS
OF THE INVENTION

The following provides a clear and complete description of the technical solutions in the embodiments of the present application, in conjunction with the accompanying drawings. It is evident that the described embodiments are only a part of the embodiments of the present application, not all of them. Based on the embodiments in the present application, all other embodiments obtained by those skilled in the art without creative labor fall within the scope of this application.

In the description of the present application, it is necessary to understand that terms such as "center," "longitudinal," "lateral," "length," "width," "thickness," "upper," "lower," "front," "back," "left," "right," "vertical," "horizontal," "top," "bottom," "inner," "outer," "clockwise," "counterclockwise," and the like, which indicate orientation or positional relationships, are based on the orientations or positions shown in the drawings. These terms are used only for the convenience of describing the application and to simplify the description, and do not imply that the indicated device or component must be constructed and operated in a particular orientation; thus, they should not be understood as limiting the present application. Furthermore, terms such as "first" and "second" are used only for descriptive purposes and should not be construed as indicating relative importance or implicitly specifying the number of technical features indicated. Accordingly, features designated as "first," "second," etc., can explicitly or implicitly include one or more of the specified features. In the description of this application, "multiple" means two or more, unless otherwise specifically defined.

In the description of this application, it should be noted that unless explicitly stated otherwise, the terms "mount," "connect," and "couple" should be understood broadly. For example, they can refer to a fixed connection, a detachable connection, or an integral connection; they can refer to a mechanical connection, an electrical connection, or a communicative connection; they can refer to a direct connection or an indirect connection through an intermediary, or to spatial communication or interaction between the internal components of two elements. For those skilled in the art, the specific meaning of these terms in the present application can be understood based on the specific context.

In the present application, unless explicitly stated otherwise, the phrase "the first feature is above (or below) the second feature" can include cases where the first and second features are in direct contact or not in direct contact but connected through another feature. Moreover, the phrase "the first feature is above, over, or on the second feature" can include the first feature being directly or indirectly above the second feature, or merely indicating that the first feature is at a higher elevation relative to the second feature. Similarly, the phrase "the first feature is below, underneath, or under the second feature" can include the first feature being directly or indirectly below the second feature, or merely indicating that the first feature is at a lower elevation relative to the second feature.

The following disclosure provides many different embodiments or examples to implement different structures of this application. To simplify the disclosure of this application, specific examples of components and configurations are described below. Certainly, these are merely examples and are not intended to limit this application. Additionally, this application may refer to the same numbers and/or letters in different examples, which is for simplification and clarity purposes only, and does not in itself indicate a relationship between the various embodiments and/or configurations being discussed. Moreover, this application provides specific examples of various processes and materials, but those skilled in the art can recognize the applicability of other processes and/or the use of other materials.

The present application addresses the technical issue of lower pixel density in existing OLED display devices caused by the necessity to reserve margins for process errors during subpixel formation using mask plates. It provides a display panel and display device to improve this issue.

As shown in FIG. 1, this embodiment provides a display panel 1, including:

a substrate 11;

a driving circuit layer 13, disposed on one side of the substrate 11;

a pixel electrode layer 14, disposed on one side of the driving circuit layer 13 that is away from the substrate 11;

an auxiliary cathode layer 15 disposed on one side of the pixel electrode layer 14 that is away from the driving circuit layer 13, the auxiliary cathode layer 15 including a first auxiliary cathode 151 and a second auxiliary cathode 152, with the first auxiliary cathode 151 positioned between the second auxiliary cathode 152 and the pixel electrode layer 14;

a light-emitting material layer 16, disposed on one side of the auxiliary cathode layer 15 that is away from the pixel electrode layer 14, the light-emitting material layer 16 including a plurality of light-emitting material sections 16a with different emitting colors; and a cathode layer 18, disposed on one side of the light-emitting material layer 16 that is away from the auxiliary cathode layer 15, the cathode layer 18 including a plurality of cathodes 181 arranged at intervals, with the cathodes 181 respectively disposed corresponding to the light-emitting material sections 16a with different emitting colors;

wherein the display panel 1 includes a plurality of subpixels 101 arranged in an array, wherein in each subpixel 101, a lateral end of the second auxiliary cathode 152 extends beyond a lateral end of the first auxiliary cathode 151, the light-emitting material layer 16 is interrupted by the auxiliary cathode layer 15, and the cathode 181 contacts a lateral side of the second auxiliary cathode 152.

This embodiment provides the display panel that features an auxiliary cathode layer, configured such that the lateral end of the second auxiliary cathode extends beyond the lateral end of the first auxiliary cathode. This setup allows for a full-surface application of light-emitting materials when forming subpixels. The auxiliary cathode layer segments the light-emitting material layer, creating the light-emitting material sections disposed corresponding the respective subpixels, with the cathodes disposed corresponding to the respective light-emitting material sections. This design prevents overlapping of light-emitting materials of different emitting colors, thereby eliminating display anomalies. Consequently, the display panel functions properly without the need for mask plates to form each subpixel, enhancing the pixel density of the display panel. Moreover, the contact between the cathode and the lateral side of the second auxiliary cathode reduces the impedance of the cathode.

Specifically, it should be understood that the illustrations in the drawings of this application are cross-sectional views. Therefore, while the drawings show the auxiliary electrode as segmented and the second auxiliary cathode as interrupted, in reality, the auxiliary electrode and the second auxiliary cathode form via holes. The parts of the auxiliary electrodes on either side of these via holes are not disconnected. Similarly, the second auxiliary cathodes are not interrupted on either side of the via holes.

In some embodiments, as shown in FIG. 1, the auxiliary cathode layer 15 also includes a third auxiliary cathode 153. This third auxiliary cathode 153 is positioned on one side of the second auxiliary cathode 152 that is away from the first auxiliary cathode 151, with the lateral end of the second auxiliary cathode 152 extending beyond a lateral end of the third auxiliary cathode 153. Incorporating the third auxiliary cathode improves the adhesion between the auxiliary cathode layer and other film layers. In addition, by segmenting the light-emitting material layer with the auxiliary cathode layer, the light-emitting material sections are created for the respective subpixels.

In some embodiments, as shown in FIG. 1, the second auxiliary cathodes 152 are made of a conductive material, and the adjacent cathodes 181 contact two sides of the second auxiliary cathode 152 positioned between the adjacent cathodes 181. This setup allows the cathodes to be connected directly along the lateral sides of the second auxiliary cathodes, eliminating the need for separate connections of the cathodes to terminal bindings.

In some embodiments, as shown in FIG. 1, the pixel electrode layer 14 includes pixel electrodes 141 and auxiliary electrodes 142, spaced apart, with the auxiliary electrodes 142 contacting the cathode layer 18. Including the pixel electrodes and the auxiliary electrodes in the pixel electrode layer allows the pixel electrodes to form an electric field with the cathode layer to facilitate the display function of the display panel. Contact between the auxiliary electrodes and the cathode layer reduces the impedance of the cathode layer, thereby enhancing the electrical performance of the display panel and reducing its power consumption.

Specifically, the auxiliary cathode layer is designed with via holes, and the auxiliary electrodes are positioned corresponding to the via holes, enabling contact between the auxiliary electrodes and the cathode layer, thus reducing the impedance of the cathode layer.

Specifically, each subpixel contains the pixel electrode and the auxiliary electrode, with the auxiliary electrode within each subpixel connected to the corresponding cathode.

In some embodiments, as shown in FIG. 1, the display panel 1 includes a display area 201. The display area 201 consists of a light-emitting area 201*a* and a non-light-emitting area 201*b*. The light-emitting material section 16*a* includes a first part 161 located in the light-emitting area 201*a*, a second part 162, and a third part 163 situated in the non-light-emitting area 201*b*. The first part 161 is positioned between the pixel electrode 141 and the cathode 181. The first part 161 extends into an area where the lateral end of the second auxiliary cathode 152 exceeds the lateral end of the first auxiliary cathode 151. The second part 162 is located between the cathode 181 and the third auxiliary cathode 153, also in the area where the lateral end of the second auxiliary cathode 152 exceeds the lateral end of the first auxiliary cathode 151. A projection of the second part 162 on the substrate overlaps with a projection of the first part 161 on the substrate, with the second auxiliary cathode 152 positioned between the first part 161 and the second part 162. In an area where the lateral end of the second auxiliary cathode 152 exceeds the lateral end of the first auxiliary cathode 151, and the third part 163 is positioned on one side of the second auxiliary cathode 152 away from the third auxiliary cathode 153, a projection of the third part 163 on the substrate overlaps with the projection of the second part 162 on the substrate, and the second auxiliary cathode 152 is also placed between the second part 162 and the third part 163.

Specifically, as illustrated in FIG. 1, the second part 162 is positioned between the cathode 181 and the third auxiliary cathode 153, and the projection of the second part 162 on the substrate 11 overlaps with the projection of the first part 161 on the substrate 11. The second auxiliary cathode 152 is placed between the first part 161 and the second part 162. In the area where the lateral end of the second auxiliary cathode 152 extends beyond the lateral end of the third auxiliary cathode 153, the third part 163 is positioned on one side of the second auxiliary cathode 152 that is away from the third auxiliary cathode 153. The projection of the third part 163 on substrate 11 overlaps with the projection of the second part 162, and the second auxiliary cathode 152 is located between the second part 162 and the third part 163.

Specifically, by including the first part in the light-emitting material section and positioning the first part between the pixel electrode and the cathode, subpixel display functionality is achieved through the pixel electrode, the first part, and the cathode. The second part is disposed between the cathode and the third auxiliary cathode, separating the second part from the first part to prevent the light-emitting area from expanding and causing display anomalies in adjacent light-emitting areas, as well as preventing water and oxygen infiltration from causing failure in the light-emitting material layer. The separation of the second part from the first part allows the cathode to overlay on the lateral side of the second auxiliary cathode, facilitating the connection of multiple cathodes and eliminating the need for multiple connection terminals to input signals to the cathodes. Additionally, the third part is positioned in the area where the lateral end of the second auxiliary cathode extends beyond the lateral end of the first auxiliary cathode. The third part is disposed between the second auxiliary cathode and the pixel electrode layer, which serves to separate the third part from the second part, further reducing the risk of water and oxygen infiltration. The third part fills a gap between the second auxiliary cathode and the first auxiliary cathode, enhancing the cathode overlay effect and preventing display anomalies caused by cathode discontinuity.

Figure 2:
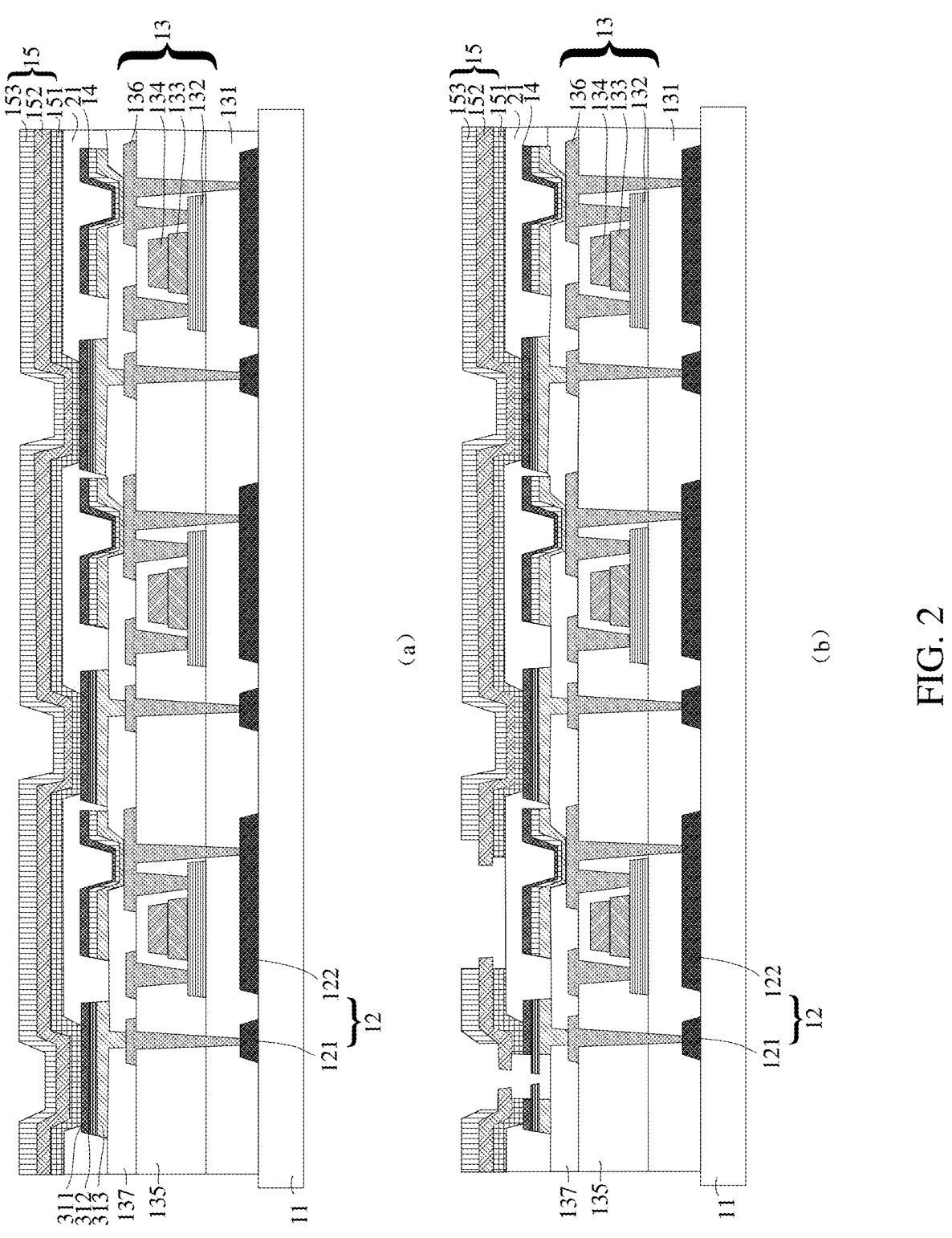
FIG. 2 is a first structural schematic view of the display panel for steps in a manufacturing method according to one embodiment of the present application.

In some embodiments, as shown in FIG. 2, the auxiliary electrode 142 includes a first electrode section 311, a second electrode section 312, and a third electrode section 313. The second electrode section 312 is positioned between the first electrode section 311 and the third electrode section 313. A lateral end of the second electrode section 312 extends beyond a lateral end of the first electrode section 311 and a lateral end of the third electrode section 313. The light-emitting material section 16*a* also includes a fourth part 164 located in the non-light-emitting area 201*b*. The fourth part 164 is positioned in the area where the lateral end of the second electrode section 312 extends beyond the lateral end of the third electrode section 313 and is placed between the second electrode section 312 and the driving circuit layer 13. By including the first, second, and third electrode sections within the auxiliary electrode, and positioning the second electrode section such that its lateral end extends beyond the lateral ends of the first and third electrode sections, the light-emitting material layer is interrupted at the lateral end of the second electrode section during the full-surface application of the light-emitting material layer. This configuration forms the fourth part of the light-emitting material. The fourth part is located in the area where the lateral end of the second electrode extends beyond the lateral end of the third electrode and positioned between the second electrode section and the driving circuit layer. This arrangement further interrupts the light-emitting material layer, creating separated parts to prevent moisture and oxygen infiltration and avoiding abnormal display issues due to light mixing in regions between adjacent subpixels.

Specifically, it is understood that the pixel electrode layer can consist of a first electrode layer, a second electrode layer, and a third electrode layer, with the second electrode layer positioned between the first electrode layer and the third electrode layer. The first electrode layer, the second electrode layer, and the third electrode layer form the first electrode section, the second electrode section, and the third electrode section, respectively. Similarly, the pixel electrode can be composed of the first, second, and third electrode layers.

Specifically, the materials for the first and third electrode layers can be either indium tin oxide (ITO) or indium zinc oxide (IZO), while the material for the second electrode layer can be silver. This configuration allows for simultaneous etching of the auxiliary cathode layer and the auxiliary electrodes, thereby eliminating the need for additional processing steps. This arrangement can create a structure where the lateral end of the second electrode section extends beyond the lateral ends of both the first and third electrode sections. Such a structure enables the auxiliary electrodes and the auxiliary cathode layer to segment the light-emitting material layer into multiple parts, thereby preventing moisture and oxygen infiltration and avoiding light mixing and display anomalies in regions between adjacent subpixels.

Specifically, it can be seen that the fourth part is positioned in the area where the lateral end of the second electrode section extends beyond the lateral end of the third electrode section. The fourth part fills a gap between the second and third electrode sections as well as the via hole in the auxiliary electrode.

In some embodiments, as shown in FIGS. 1 and 2, the auxiliary electrodes 142 include via holes, and the cathodes 181 are positioned in these via holes. The cathode 181 makes contact with a lateral side of the second electrode section 312. The formation of the via holes in the auxiliary electrodes allows the cathodes to be placed in these via holes, enabling the cathodes to contact lateral sides of the second electrode sections. This setup facilitates the connection between the cathode and the second electrode section, reducing the impedance of the cathode.

Specifically, it can be seen that the cathode makes side contact with the lateral side of the second electrode section and also with the lateral side of the second auxiliary cathode. The auxiliary cathode layer makes contact with the auxiliary electrodes, thereby connecting the cathode, the auxiliary cathode layer, and the auxiliary electrode together. This configuration reduces the impedance of the cathode and, by segmenting the light-emitting material layer into multiple parts through the auxiliary cathode layer and auxiliary electrodes, enhances the effectiveness of barriers. This improvement increases the ability to block moisture and oxygen from penetrating the light-emitting material layer.

In the embodiments described above, the material and structure of the pixel electrode layer are presented as being the same as those of the auxiliary cathode layer for illustrative purposes. When the material and structure of the pixel electrode layer differ from those of the auxiliary cathode layer, the etching material intended for the auxiliary cathode layer might not effectively etch the pixel electrode layer. In such cases, the auxiliary electrodes do not achieve a configuration where the lateral end of the second electrode section extends beyond the lateral ends of the first and third electrode sections. Consequently, the common electrode could make contact with the upper surface of the auxiliary electrodes. However, this embodiment is not confined to these conditions; when the materials and structures of the pixel electrode layer and the auxiliary cathode layer differ, separate etching of the pixel electrode layer and the auxiliary cathode layer can be conducted to create the specified structures of the auxiliary electrodes and the auxiliary cathode layer.

In some embodiments, as shown in FIG. 1, the driving circuit layer 13 includes a light-shielding layer 12. The light-shielding layer 12 includes a first connection electrode 121 and a second connection electrode 122, spaced apart. The first connection electrode 121 is electrically connected to the auxiliary electrode 142, while the second connection electrode 122 is electrically connected to the pixel electrode 141. By incorporating the light-shielding layer that includes both the first and second connection electrodes, and electrically connecting the first connection electrode to the auxiliary electrode, the voltage drop of signals transmitted to the auxiliary electrodes is reduced. Similarly, electrically connecting the second connection electrode to the pixel electrode reduces the voltage drop in signals transmitted to the pixel electrodes. This setup helps to prevent excessive signal attenuation within the display panel, thereby reducing the power consumption of the display panel and improving the uniformity of the display.

Specifically, as shown in FIG. 1, the driving circuit layer 13 includes a source-drain layer 136. The first connection electrode 121 is connected to the auxiliary electrode through a metal connection in the source-drain layer 136, which reduces the impedance of the cathode, minimizing the loss during signal transmission through the cathode layer and preventing excessive voltage drop that could degrade display uniformity.

Specifically, the source-drain layer 136 includes a first electrode and a second electrode. The second connection electrode 122 is connected to the second electrode. The second electrode is connected to the pixel electrode. This setup reduces the signal loss transmitted to the pixel electrode and prevents excessive voltage drop in signals transmitted to the pixel electrode, thereby avoiding a decline in display uniformity across the display panel.

In some embodiments, the material of the first auxiliary cathode can be either indium tin oxide (ITO) or indium zinc oxide (IZO), the second auxiliary cathode is made of silver, and the third auxiliary cathode is made of either ITO or IZO. By having the second auxiliary cathode made of a different material from the first and third auxiliary cathodes, when the auxiliary cathode layer is etched, the second auxiliary cathode etches at different rates than the first and third auxiliary cathodes under different etching materials, causing the lateral end of the second auxiliary cathode to extend beyond the lateral ends of the first and third auxiliary cathodes. This enables the auxiliary cathode layer to segment the light-emitting material layer at the areas where the second auxiliary cathode exceeds the first and third auxiliary cathodes. Consequently, this arrangement enables the formation of distinct light-emitting material sections in the subpixels.

Specifically, taking the first auxiliary cathode made of indium tin oxide (ITO), the second auxiliary cathode made of silver, and the third auxiliary cathode made of ITO as an example, one can first etch the auxiliary cathode layer using an acid that can etch silver, followed by using an acid that etches ITO. This sequence allows the formation of a structure where the second auxiliary cathode extends beyond both the first and third auxiliary cathodes, without the need for additional process steps.

Specifically, when using a silver-ITO stack where a silver layer extends beyond an ITO layer, there can be insufficient adhesion between the silver layer and the underlying insulating layer, leading to potential delamination issues in the display panel. In this application, by ensuring the ITO layer contacts the underlying insulating layer, the adhesion between the auxiliary cathode layer and the insulating layer is enhanced, thereby preventing delamination issues in the display panel.

In some embodiments, the display panel additionally includes an inorganic layer. The inorganic layer is positioned on one side of the cathode layer that is away from the light-emitting material layer. The inorganic layer includes a plurality of inorganic sections. The inorganic section is disposed corresponding to the cathode. In the display panel design that includes an inorganic layer composed of multiple inorganic sections aligned with the cathodes, the inorganic sections are formed following the formation of the light-emitting material sections with three different emitting colors and their corresponding cathodes, wherein one inorganic section is formed after the formation of one light-emitting material section and one cathode. This helps to prevent moisture and oxygen infiltration into the light-emitting material sections during subsequent layer fabrication processes, thus preventing the malfunction of the light-emitting material sections.

In some embodiments, as shown in FIG. 1, the display panel 1 further includes an insulation layer 19. The insulation layer 19 is positioned on one side of the cathode layer 18 that is away from the light-emitting material layer 16. The insulating layer 19 covers the cathodes 181 as well as gaps between adjacent cathodes 181. By covering the cathodes and the gaps between the adjacent cathodes with the insulation layer, the present application prevents moisture and oxygen infiltration and avoids interference between adjacent subpixels.

Specifically, as shown in FIG. 1, the light-emitting material section 16a includes a first light-emitting material section 171, a second light-emitting material section 172, and a third light-emitting material section 173. The spaced cathodes 181 are correspondingly aligned with the first light-emitting material section 171, the second light-emitting material section 172, and the third light-emitting material section 173.

Specifically, as can be understood from FIG. 1, the light-emitting material section 16a includes the first light-emitting material section 171, the second light-emitting material section 172, and the third light-emitting material section 173. Each of the first light-emitting material section 171, the second light-emitting material section 172, and the third light-emitting material section 173 includes the first part 161, the second part 162, the third part 163, and the fourth part 62.

Specifically, the first light-emitting material section emits red light, the second light-emitting material section emits blue light, and the third light-emitting material section emits green light.

Specifically, as shown in FIG. 1, the driving circuit layer 13 further includes a buffer layer 131, an active layer 132, a gate insulating layer 133, a gate layer 134, an interlayer insulating layer 135, and a passivation layer 137.

Specifically, FIG. 1 illustrates thin-film transistors in the driving circuit layer as top-gate bottom-contact thin-film transistors as an example. However, this embodiment is not limited to this configuration; the thin-film transistors could be any type among top-gate top-contact, bottom-gate bottom-contact, or bottom-gate top-contact thin-film transistors.

Specifically, as shown in FIG. 1, the display panel 1 also includes a pixel definition layer 21.

Specifically, the display panel can include an encapsulation layer, which can consist of stacked inorganic and organic film layers.

Figure 3:
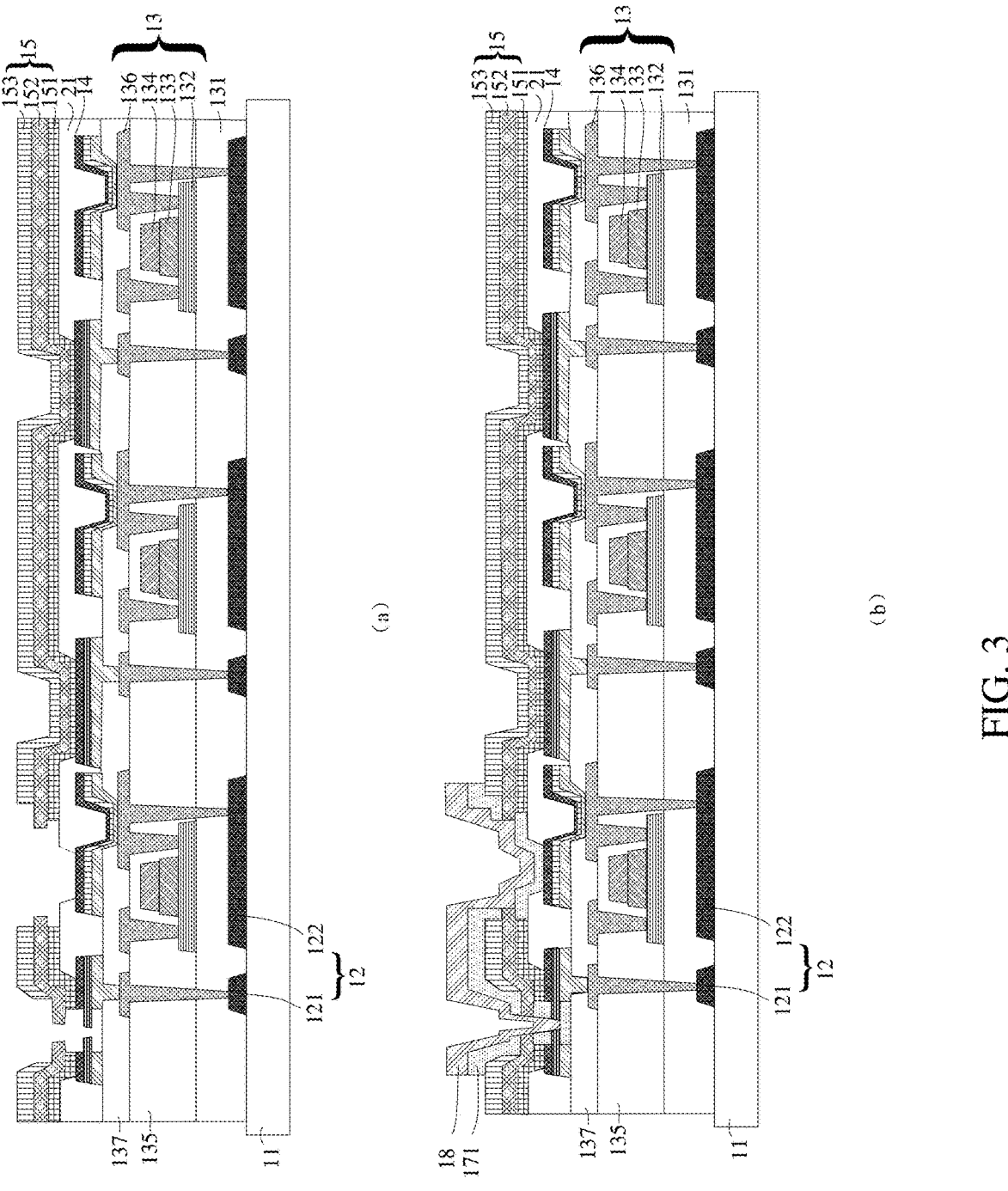
FIG. 3 shows a second structural schematic view of the display panel for steps in the manufacturing method according to one embodiment of the present application.
Figure 4:
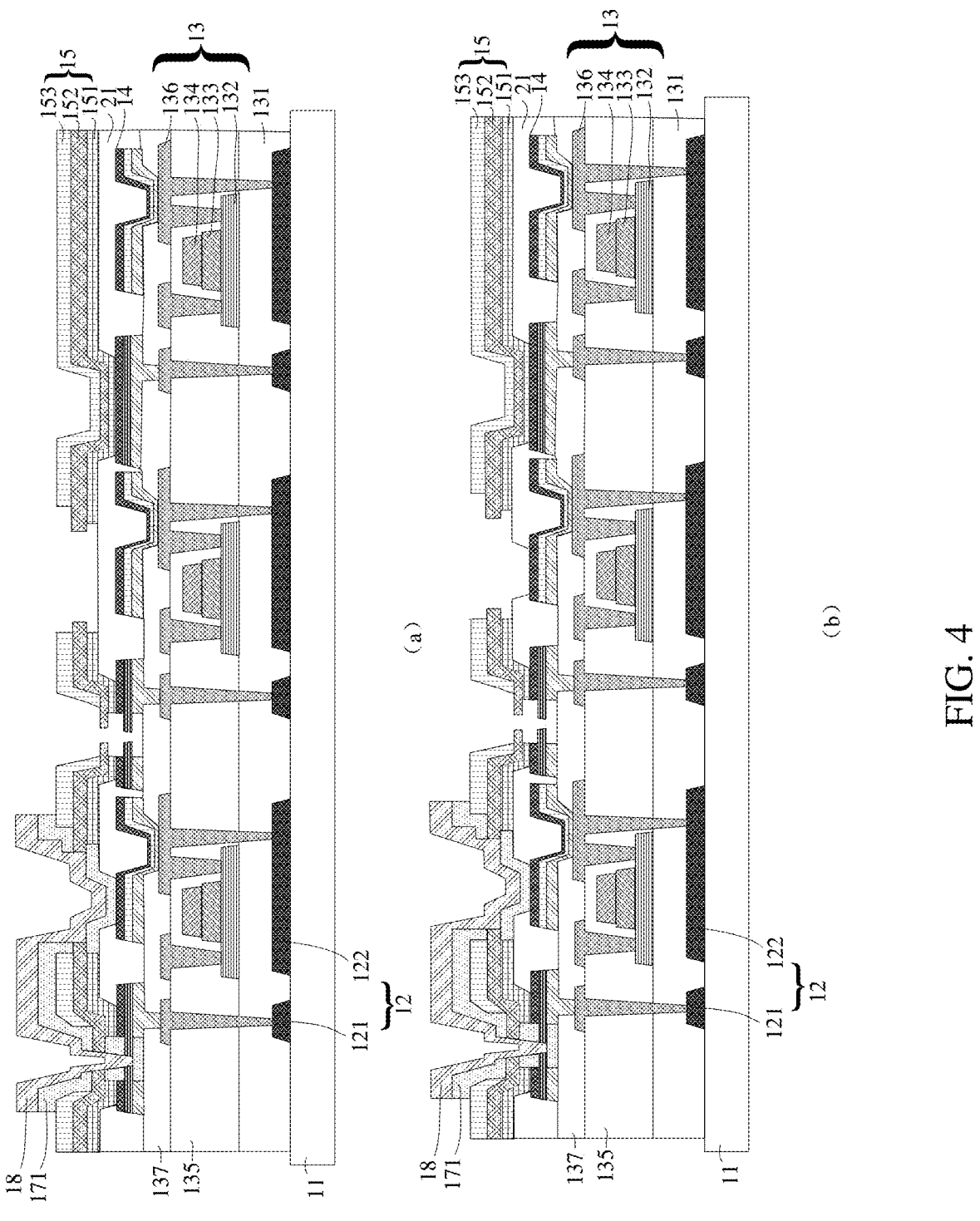
FIG. 4 depicts a third structural schematic view of the display panel for steps in the manufacturing method provided by one embodiment of the present application.
Figure 5:
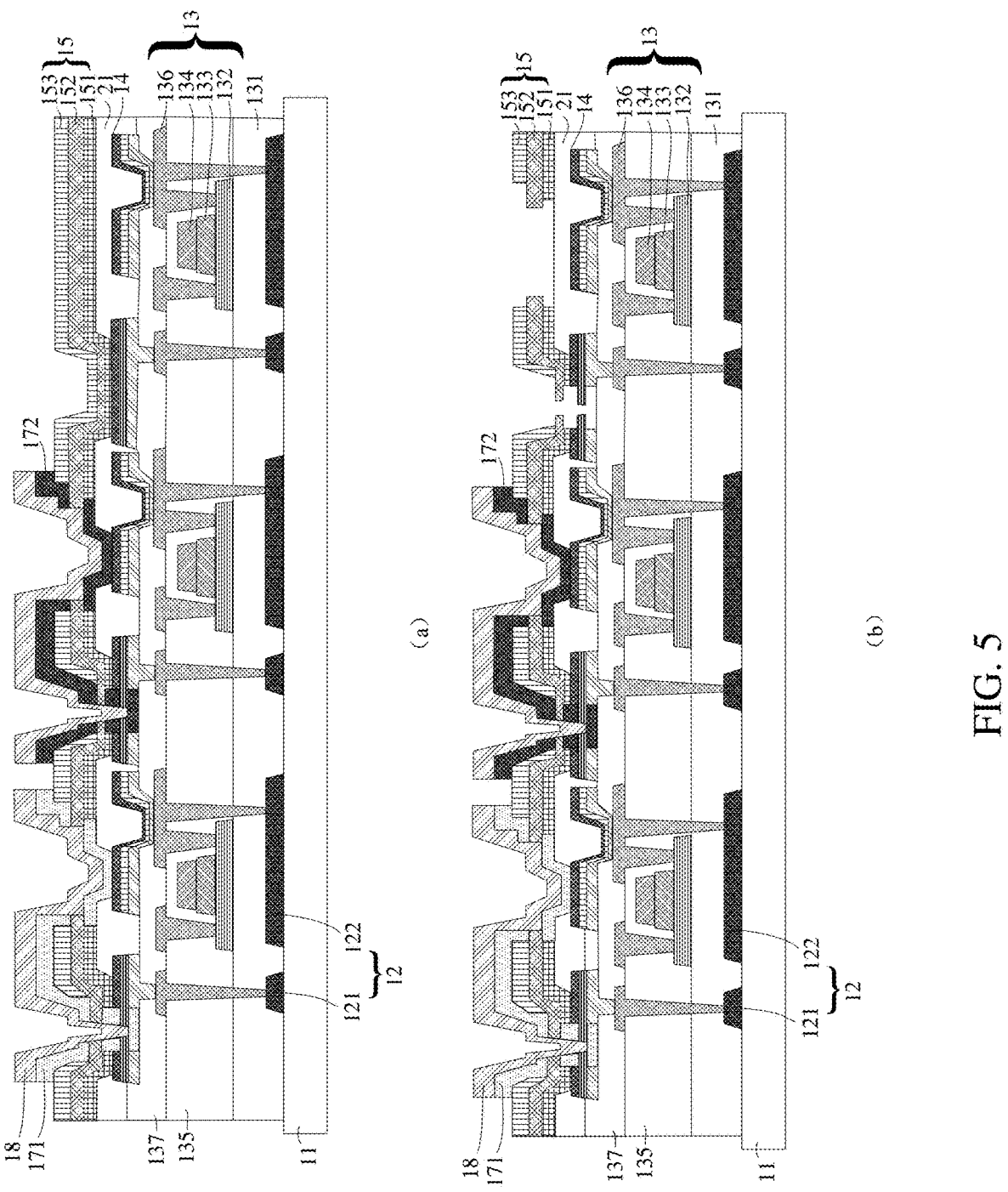
FIG. 5 depicts a fourth structural schematic view of the display panel for steps in the manufacturing method provided by one embodiment of the present application.
Figure 6:
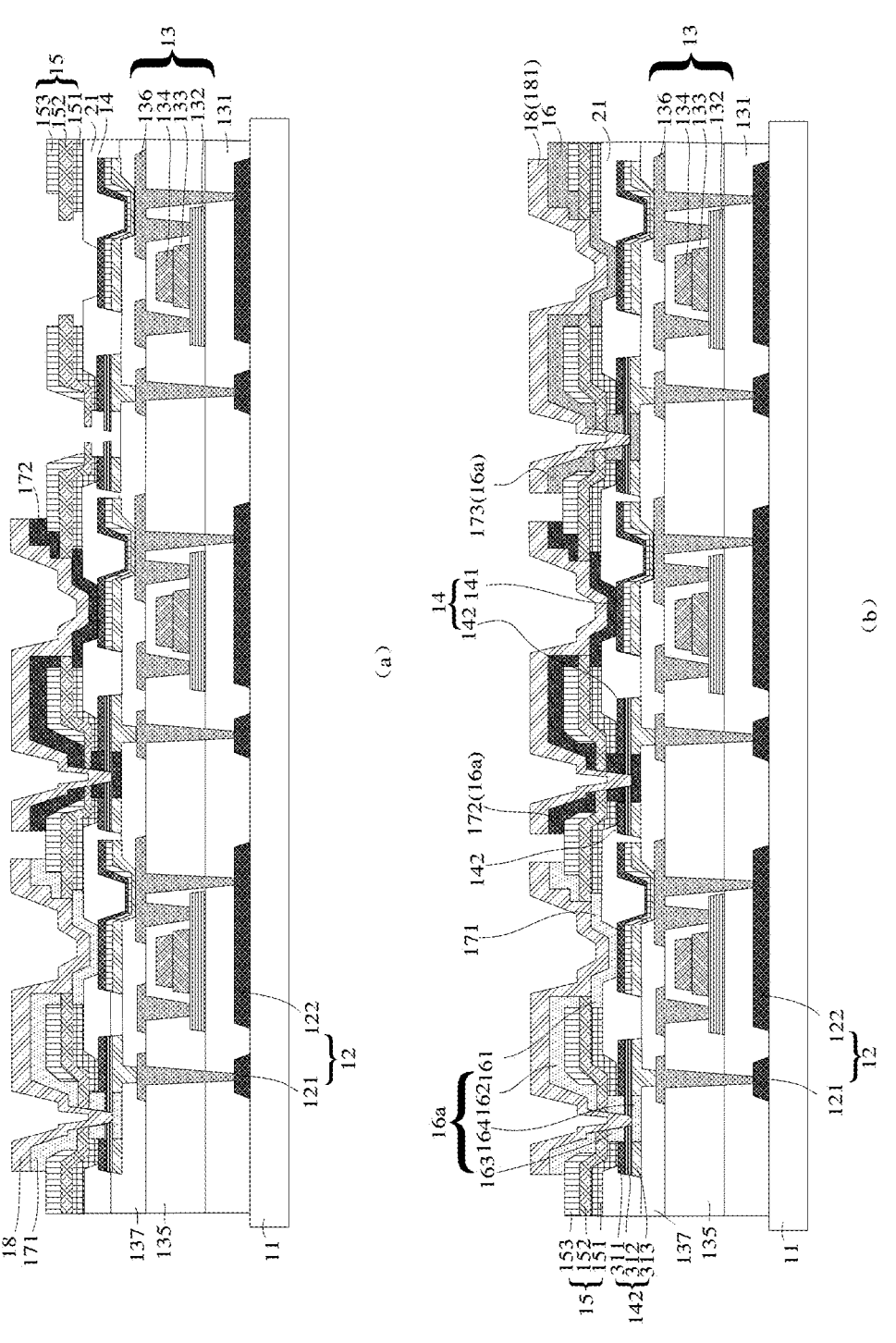
FIG. 6 depicts a fifth structural schematic view of the display panel for steps in the manufacturing method provided by one embodiment of the present application.

FIG. 2 depicts a first structural schematic view of the display panel, illustrating steps in a manufacturing method of the display panel according to one embodiment of the present application. FIG. 3 shows a second structural schematic view of the display panel, illustrating steps in the manufacturing method according to one embodiment of the present application. FIG. 4 depicts a third structural schematic view of the display panel, illustrating steps in the manufacturing method according to one embodiment of the present application. FIG. 5 depicts a fourth structural schematic view of the display panel, illustrating steps in the manufacturing method according to one embodiment of the present application. FIG. 6 represents a fifth structural schematic view of the display panel, illustrating steps in the manufacturing method according to one embodiment of the present application.

Additionally, the present application provides a manufacturing method of the display panel, which includes the following steps:

Provide the substrate and sequentially form the driving circuit layer, the pixel electrode layer, the pixel definition layer, and the auxiliary cathode layer on the substrate. The structure of the display panel corresponding to this step is shown in FIG. 2(a).

Etch the auxiliary cathode layer in an area corresponding to the first light-emitting material section to configure the lateral end of the second auxiliary cathode to extend beyond the lateral ends of the first and third auxiliary cathodes. The structure of the display panel corresponding to this step is shown in FIG. 2(b).

Specifically, this can be done by first etching the auxiliary cathode layer with an acid that etches silver, followed by an acid that etches indium tin oxide. Given that the pixel electrode layer uses a stacked structure of indium tin oxide/silver/indium tin oxide, the etching of the auxiliary cathode layer simultaneously etches the pixel electrode layer.

Expose and etch the passivation layer over the area corresponding to the first light-emitting material section; the structure of the display panel corresponding to this step is shown in FIG. 3(a).

Deposit a red light-emitting material layer and a cathode layer on the auxiliary cathode layer, followed by photolithographic exposure. Pattern the red light-emitting material layer and the cathode layer through wet and dry etching processes to form the first light-emitting material section and its corresponding cathode; the structure of the display panel corresponding to this step is shown in FIG. 3(b).

Etch the auxiliary cathode layer in an area corresponding to the second light-emitting material section so that the lateral end of the second auxiliary cathode extends beyond the lateral ends of both the first and third auxiliary cathodes; the structure of the display panel corresponding to this step is shown in FIG. 4(a).

Expose and etch the passivation layer over the area corresponding to the second light-emitting material section; the structure of the display panel corresponding to this step is shown in FIG. 4(b).

Deposit a blue light-emitting material layer and a cathode layer on the auxiliary cathode layer, followed by photolithographic exposure. Pattern the blue light-emitting material layer and the cathode layer through wet and dry etching processes to form the second light-emitting material section and its corresponding cathode; the structure of the display panel corresponding to this step is shown in FIG. 5(a).

Etch the auxiliary cathode layer in an area corresponding to the third light-emitting material section so that the lateral end of the second auxiliary cathode extends beyond the lateral ends of both the first and third auxiliary cathodes; the structure of the display panel corresponding to this step is shown in FIG. 5(b).

Expose and etch the passivation layer over the area corresponding to the third light-emitting material section; the structure of the display panel corresponding to this step is shown in FIG. 6(a).

Deposit a green light-emitting material layer and a cathode layer on the auxiliary cathode layer, followed by photolithographic exposure. Pattern the green light-emitting material layer and the cathode layer through wet and dry etching processes to form the third light-emitting material section and its corresponding cathode; the structure of the display panel corresponding to this step is shown in FIG. 6(b).

Form an insulation layer on the cathode layer; the structure of the display panel corresponding to this step is shown in FIG. 1.

The present application provides a manufacturing method of a display panel, which includes setting up an auxiliary cathode layer and etching specific parts of the auxiliary cathode layer corresponding to different light-emitting areas. This approach allows the light-emitting materials of different emitting colors to be segmented by the auxiliary cathode layer during full-face application of the light-emitting materials. By eliminating the need for using mask plates to pattern the light-emitting materials of different emitting colors, this method enhances the pixel density of the display panel.

Additionally, the present application provides a display device that includes any of the display panels as described in the above embodiments.

According to the above embodiments, the present application provides a display panel and a display device. The display panel includes a substrate, a driving circuit layer, a pixel electrode layer, an auxiliary cathode layer, a light-emitting material layer, and a cathode layer. The driving circuit layer is positioned on one side of the substrate, while the pixel electrode layer is disposed on one side of the driving circuit layer that is away from the substrate. The auxiliary cathode layer is located on one side of the pixel electrode layer that is away from the driving circuit layer, and the auxiliary cathode layer includes a first auxiliary cathode and a second auxiliary cathode. The first auxiliary cathode is situated between the second auxiliary cathode and the pixel electrode layer. The light-emitting material layer is set on one side of the auxiliary cathode layer that is away from the pixel electrode layer and includes multiple light-emitting material sections capable of emitting light of different colors. The cathode layer is located on one side of the light-emitting material layer that is away from the auxiliary cathode layer and includes multiple spaced cathodes, the cathodes respectively disposed corresponding to the light-emitting material sections of different emitting colors. The display panel includes an array of multiple subpixels, with each subpixel having the lateral end of the second auxiliary cathode extending beyond the lateral end of the first auxiliary cathode. The light-emitting material layer is segmented by the auxiliary cathode layer, and the cathode contacts the lateral side of the second auxiliary cathode. By configuring the auxiliary cathode layer to extend the lateral end of the second auxiliary cathode beyond the lateral end of the first auxiliary cathode, this setup enables a full-surface application of light-emitting materials during the formation of the light-emitting material sections in the subpixels. The auxiliary cathode layer segments the light-emitting material layer, creating the light-emitting material sections corresponding to the respective subpixels, with corresponding cathodes aligned to the light-emitting material sections. This arrangement prevents the overlap of the light-emitting material sections of different emitting colors, thus avoiding display anomalies and ensuring proper functionality of the display panel without the need for mask plates in forming the subpixels. This design not only enhances the pixel density of the display panel but also reduces the cathode's impedance by facilitating direct contact between the cathode and the lateral side of the second auxiliary cathode.

In the above embodiments, the descriptions focus on different aspects of each embodiment. Parts that are not detailed in a particular embodiment can be referenced in the relevant descriptions of other embodiments.

The foregoing provides a detailed description of the display panel and the display device presented in the present application. Specific examples have been used herein to explain the principles and implementation methods of this application. The explanations of these embodiments are intended to assist in understanding the technical solutions and core ideas of this application. It should be understood by those skilled in the art that modifications can be made to the technical solutions described in the previous embodiments, or some technical features can be equivalently replaced. These modifications or replacements do not deviate from the essence of the technical solutions of the corresponding embodiments in this application.

What is claimed is:

1. A display panel, comprising:
a substrate;
a driving circuit layer disposed on one side of the substrate;
a pixel electrode layer disposed on one side of the driving circuit layer away from the substrate;
an auxiliary cathode layer disposed on one side of the pixel electrode layer away from the driving circuit layer, wherein the auxiliary cathode layer comprises a first auxiliary cathode and a second auxiliary cathode, and the first auxiliary cathode is disposed between the second auxiliary cathode and the pixel electrode layer;
a light-emitting material layer disposed on one side of the auxiliary cathode layer away from the pixel electrode layer, wherein the light-emitting material layer comprises a plurality of light-emitting material sections of different emitting colors; and
a cathode layer disposed on one side of the light-emitting material layer away from the auxiliary cathode layer, wherein the cathode layer comprises a plurality of cathodes arranged spaced from each other, and the cathodes are respectively aligned with the light-emitting material sections of different emitting colors;
wherein the display panel comprises a plurality of sub-pixels arranged in an array; within each of the subpixels, a lateral end of the second auxiliary cathode extends beyond a lateral end of the first auxiliary cathode, the auxiliary cathode layer segments the light-emitting material layer, and the cathode contacts a lateral side of the second auxiliary cathode.

2. The display panel according to claim 1, wherein the auxiliary cathode layer further comprises a third auxiliary cathode, the third auxiliary cathode is disposed on one side of the second auxiliary cathode that is away from the first auxiliary cathode, and the lateral end of the second auxiliary cathode extends beyond a lateral end of the third auxiliary cathode.

3. The display panel according to claim 2, wherein adjacent ones of the cathodes contact two lateral sides of the second auxiliary cathode disposed between the adjacent cathodes.

4. The display panel according to claim 3, wherein the pixel electrode layer comprises a plurality of pixel electrodes and a plurality of auxiliary electrodes, the pixel electrodes and the auxiliary electrodes are arranged at intervals, and the auxiliary electrodes contact the cathode layer.

5. The display panel according to claim 4, further comprising a display area, wherein the display area comprises a light-emitting area and a non-light-emitting area, wherein the light-emitting material section comprises a first part, a second part, and a third part; the first part is disposed in the light-emitting area and arranged between the pixel electrode and the cathode, and the first part extends into an area where the lateral end of the second auxiliary cathode extends beyond the lateral end of the first auxiliary cathode; the second part is disposed in the non-light-emitting area and extends into the light-emitting area and arranged between the cathode and the third auxiliary cathode, and the second part extends into an area where the lateral end of the second auxiliary cathode extends beyond the lateral end of the first auxiliary cathode; a projection of the second part on the substrate overlaps with a projection of the first part on the substrate, and the second auxiliary cathode is located between the first part and the second part; in an area where the lateral end of the second auxiliary cathode extends beyond the lateral end of the third auxiliary cathode, the third part is disposed on one side of the second auxiliary cathode that is away from the third auxiliary cathode, and a projection of the third part on the substrate overlaps with the projection of the second part on the substrate, with the second auxiliary cathode disposed between the second part and the third part.

6. The display panel according to claim 5, wherein the auxiliary electrode comprises a first electrode section, a second electrode section, and a third electrode section; the second electrode section is disposed between the first electrode section and the third electrode section, with a lateral end of the second electrode section extending beyond lateral ends of both the first electrode section and the third electrode section; the light-emitting material section further comprises a fourth part disposed in the non-light-emitting area; the fourth part is disposed in an area where the lateral end of the second electrode section extends beyond the lateral end of the third electrode section, and is arranged between the second electrode section and the driving circuit layer.

7. The display panel according to claim 6, wherein the auxiliary electrode comprises a via hole, the cathode is disposed in the via hole, and the cathode contacts lateral sides of the second electrode section.

8. The display panel according to claim 4, wherein the driving circuit layer comprises a light-shielding layer, the light-shielding layer comprises a first connection electrode and a second connection electrode spaced apart from each other, the first connection electrode is electrically connected to the auxiliary electrode, and the second connection electrode is electrically connected to the pixel electrode.

9. The display panel according to claim 1, further comprising an inorganic layer, wherein the inorganic layer is disposed on one side of the cathode layer that is away from the light-emitting material layer, the inorganic layer comprises a plurality of inorganic sections, and the inorganic sections are disposed corresponding to the cathodes.

10. A display device, comprising a display panel, wherein the display panel comprises:

a substrate;

a driving circuit layer disposed on one side of the substrate;

a pixel electrode layer disposed on one side of the driving circuit layer away from the substrate;

an auxiliary cathode layer disposed on one side of the pixel electrode layer away from the driving circuit layer, wherein the auxiliary cathode layer comprises a first auxiliary cathode and a second auxiliary cathode, and the first auxiliary cathode is disposed between the second auxiliary cathode and the pixel electrode layer;

a light-emitting material layer disposed on one side of the auxiliary cathode layer away from the pixel electrode layer, wherein the light-emitting material layer comprises a plurality of light-emitting material sections of different emitting colors; and a cathode layer disposed on one side of the light-emitting material layer away from the auxiliary cathode layer, wherein the cathode layer comprises a plurality of cathodes arranged spaced from each other, and the cathodes are respectively aligned with the light-emitting material sections of different emitting colors;

wherein the display panel comprises a plurality of subpixels arranged in an array; within each of the subpixels, a lateral end of the second auxiliary cathode extends beyond a lateral end of the first auxiliary cathode, the auxiliary cathode layer segments the light-emitting material layer, and the cathode contacts a lateral side of the second auxiliary cathode.

11. The display device according to claim 10, wherein the auxiliary cathode layer further comprises a third auxiliary cathode, the third auxiliary cathode is disposed on one side of the second auxiliary cathode that is away from the first auxiliary cathode, and the lateral end of the second auxiliary cathode extends beyond a lateral end of the third auxiliary cathode.

12. The display device according to claim 11, wherein adjacent ones of the cathodes contact two lateral sides of the second auxiliary cathode disposed between the adjacent cathodes.

13. The display device according to claim 12, wherein the pixel electrode layer comprises a plurality of pixel electrodes and a plurality of auxiliary electrodes, the pixel electrodes and the auxiliary electrodes are arranged at intervals, and the auxiliary electrodes contact the cathode layer.

14. The display device according to claim 13, wherein the display panel further comprises a display area, and the display area comprises a light-emitting area and a non-light-emitting area, wherein the light-emitting material section comprises a first part, a second part, and a third part; the first part is disposed in the light-emitting area and arranged between the pixel electrode and the cathode, and the first part extends into an area where the lateral end of the second auxiliary cathode extends beyond the lateral end of the first auxiliary cathode; the second part is disposed in the non-light-emitting area and extends into the light-emitting area and arranged between the cathode and the third auxiliary cathode, and the second part extends into an area where the lateral end of the second auxiliary cathode extends beyond the lateral end of the first auxiliary cathode; a projection of the second part on the substrate overlaps with a projection of the first part on the substrate, and the second auxiliary cathode is located between the first part and the second part; in an area where the lateral end of the second auxiliary cathode extends beyond the lateral end of the third auxiliary cathode, the third part is disposed on one side of the second auxiliary cathode that is away from the third auxiliary cathode, and a projection of the third part on the substrate overlaps with the projection of the second part on the substrate, with the second auxiliary cathode disposed between the second part and the third part.

15. The display device according to claim 14, wherein the auxiliary electrode comprises a first electrode section, a second electrode section, and a third electrode section; the second electrode section is disposed between the first electrode section and the third electrode section, with a lateral end of the second electrode section extending beyond lateral ends of both the first electrode section and the third electrode section; the light-emitting material section further comprises a fourth part disposed in the non-light-emitting area; the fourth part is disposed in an area where the lateral end of the second electrode section extends beyond the lateral end of the third electrode section, and is arranged between the second electrode section and the driving circuit layer.

16. The display device according to claim 15, wherein the auxiliary electrode comprises a via hole, the cathode is disposed in the via hole, and the cathode contacts lateral sides of the second electrode section.

17. The display device according to claim 13, wherein the driving circuit layer comprises a light-shielding layer, the light-shielding layer comprises a first connection electrode and a second connection electrode spaced apart from each other, the first connection electrode is electrically connected to the auxiliary electrode, and the second connection electrode is electrically connected to the pixel electrode.

18. The display device according to claim 10, wherein the display panel further comprises an inorganic layer, the inorganic layer is disposed on one side of the cathode layer that is away from the light-emitting material layer, the inorganic layer comprises a plurality of inorganic sections, and the inorganic sections are disposed corresponding to the cathodes.

* * * * *